(12) United States Patent
Lu et al.

(10) Patent No.: US 10,203,420 B2
(45) Date of Patent: Feb. 12, 2019

(54) DUAL SIDED TAPE ATTACHMENT TO CATHODE ELECTRODE OF RADIATION DETECTOR

(71) Applicant: REDLEN TECHNOLOGIES, INC., Saanichton (CA)

(72) Inventors: Pinghe Lu, Victoria (CA); Michael Ayukawa, Victoria (CA); Christopher Read, Victoria (CA); Robert Crestani, Vancouver (CA); Jeffrey Walton, Victoria (CA)

(73) Assignee: REDLEN TECHNOLOGIES, INC., Saanichton (CA)

( * ) Notice: Subject to any disclaimer, the term of this patent is extended or adjusted under 35 U.S.C. 154(b) by 83 days.

(21) Appl. No.: 15/592,368

(22) Filed: May 11, 2017

(65) Prior Publication Data
US 2018/0329079 A1    Nov. 15, 2018

(51) Int. Cl.
| C09J 7/00 | (2018.01) |
| G01T 1/17 | (2006.01) |
| B29C 65/48 | (2006.01) |
| B29L 31/34 | (2006.01) |

(52) U.S. Cl.
CPC ............ *G01T 1/17* (2013.01); *B29C 65/4855* (2013.01); *B29L 2031/34* (2013.01); *C09J 7/00* (2013.01)

(58) Field of Classification Search
None
See application file for complete search history.

(56) References Cited

U.S. PATENT DOCUMENTS

| 8,071,953 | B2 | 12/2011 | Lu et al. |
| 9,202,961 | B2 | 12/2015 | Chen et al. |
| 2004/0191509 | A1* | 9/2004 | Kishioka ........... B32B 7/10 428/354 |
| 2010/0193694 | A1 | 8/2010 | Chen et al. |
| 2011/0316816 | A1* | 12/2011 | Okuma ........... G09G 3/3688 345/204 |
| 2011/0318579 | A1* | 12/2011 | Husemann ......... C09J 133/08 428/355 AC |

(Continued)

FOREIGN PATENT DOCUMENTS

| JP | 2000-319599 | * 11/2000 |
| JP | 2010-138317 | * 6/2010 |

OTHER PUBLICATIONS

Machine Translation JP 2000-319599.*
Machine Translation JP 2010-138317.*

*Primary Examiner* — Yara B Green
(74) *Attorney, Agent, or Firm* — The Marbury Law Group PLLC

(57) ABSTRACT

A cathode conductive strip can be attached to a semiconductor radiation sensor by using a double sided dual adhesive electrically conductive tape in a sensor assembly or a detector module to provide reliable electrical connection between the semiconductor radiation sensor and the cathode conductive strip. The double sided dual adhesive electrically conductive tape includes an electrically conductive backing with two different adhesion strength adhesives on both sides. The high adhesion strength side is bonded to the cathode electrode of the semiconductor radiation sensor. The lower adhesion strength side is bonded to the conductive face of the cathode conductive strip.

22 Claims, 3 Drawing Sheets

(56) References Cited

U.S. PATENT DOCUMENTS

| | | | |
|---|---|---|---|
| 2014/0023885 A1* | 1/2014 | Choi | H01M 2/34 429/7 |
| 2016/0009961 A1* | 1/2016 | Yamada | C09J 133/08 428/41.5 |
| 2016/0240584 A1 | 8/2016 | El-Hanany et al. | |
| 2016/0362586 A1* | 12/2016 | Kiyoto | C09J 7/29 |

* cited by examiner

DUAL SIDED TAPE ATTACHMENT TO CATHODE ELECTRODE OF RADIATION DETECTOR

FIELD

The present invention relates generally to gamma-ray and X-ray detectors and more specifically, to high voltage (HV) connection methods to the cathodes of cadmium zinc telluride radiation detectors.

BACKGROUND

Room temperature pixelated radiation detectors made of semiconductors, such as Cadmium Zinc Telluride ($Cd_{1-x}Zn_xTe$ where $0<x<1$, or "CZT"), are gaining popularity for use in medical and non-medical imaging. These applications dictate that these detectors have to exhibit both high energy resolution and sensitivity. Since these detectors form a crucial part of complex imaging systems they should be highly reliable with a cost low enough to suit market requirements.

SUMMARY

According to an aspect of the present disclosure, a method of making a radiation detector system is provided. The method includes the steps of: providing a double sided dual adhesive electrically conductive tape including an electrically conductive high adhesion strength adhesive layer on one side and an electrically conductive low adhesion strength adhesive layer having a lesser peel strength than the electrically conductive high adhesion strength adhesive layer on another side; attaching the electrically conductive high adhesion strength adhesive layer to a surface of a cathode electrode of a radiation sensor; and attaching the electrically conductive low adhesion strength adhesive layer to a conductive layer of a cathode conductive strip.

According to another aspect of the present disclosure, a radiation detector system is provided, which comprises: a double sided dual adhesive electrically conductive tape including an electrically conductive high adhesion strength adhesive layer on one side and an electrically conductive low adhesion strength adhesive layer having a lesser peel strength than the electrically conductive high adhesion strength adhesive layer on another side; a radiation sensor including a cathode electrode, wherein the electrically conductive high adhesion strength adhesive layer is attached to a surface of the cathode electrode; and a cathode conductive strip including a conductive layer. The electrically conductive low adhesion strength adhesive layer is attached to the metal conductive layer.

DETAILED DESCRIPTION

Figure 1:
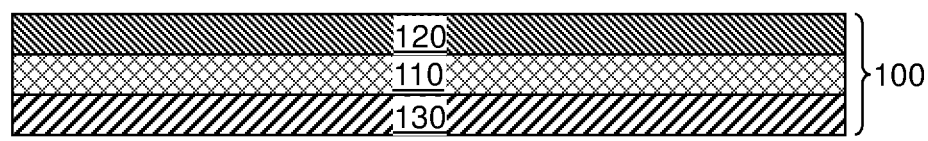
FIG. 1 is a schematic cross-sectional view of a double sided dual adhesive electrically conductive tape employed in the methods and structures of the present disclosure.

As discussed above, the present disclosure is directed to high voltage (HV) connection methods to the cathodes of cadmium zinc telluride or other radiation detectors, the various aspects of which are described herein with reference to the drawings.

The various embodiments will be described in detail with reference to the accompanying drawings. Wherever possible, the same reference numbers will be used throughout the drawings to refer to the same or like parts. References made to particular examples and implementations are for illustrative purposes, and are not intended to limit the scope of the invention or the claims. Any reference to claim elements in the singular, for example, using the articles "a," "an," or "the" is not to be construed as limiting the element to the singular. The terms "example," "exemplary," or any term of the like are used herein to mean serving as an example, instance, or illustration. References to particular examples and implementations are for illustrative purposes, and are not intended to limit the scope of the invention or the claims. Any implementation described herein as an "example" is not necessarily to be construed as preferred or advantageous over another implementation. The drawings are not drawn to scale. Multiple instances of an element may be duplicated where a single instance of the element is illustrated, unless absence of duplication of elements is expressly described or clearly indicated otherwise.

Embodiments of the present disclosure provide a reliable attachment of a cathode electrode to a cathode of a radiation detector (e.g., radiation sensor). A cathode conductive strip can be attached to a semiconductor radiation sensor by using a double sided dual adhesive electrically conductive tape in a sensor assembly or a detector module to provide reliable electrical connection between the semiconductor radiation sensor and a cathode conductive strip. The double sided dual adhesive electrically conductive tape includes an electrically conductive backing with a different adhesion strength adhesive on each side. The higher adhesion strength side is bonded to the cathode electrode of the semiconductor radiation sensor. The lower adhesion strength side is bonded to the conductive face of the cathode conductive strip.

The non-limiting potential advantages of utilizing the double sided dual adhesive electrically conductive tape as a bonding media include: 1) ease of attaching a cathode sensor assembly by using the double sided dual adhesive electrically conductive tape; 2) ability to remove and re-attach the cathode conductive strip without causing damage to the soft and fragile cathode electrode metallization of the radiation sensors; 3) scalability to numbers and dimensions of radiation sensors that are combined together in an array; 4)

uniform radiation attenuation across the whole cathode surface of a single or an array of radiation sensors; 5) ability to accommodate non-planarity of cathode surfaces of radiation sensors that are combined together; 6) thin, sub-millimeter low profile cathode connection; 7) lower cost.

Referring to FIG. 1, a double sided dual adhesive electrically conductive tape 100 employed in embodiments of the present disclosure includes an electrically conductive backing layer 110 coated with an electrically conductive high adhesion strength adhesive layer 130 on one side and an electrically conductive low adhesion strength adhesive layer 120 coated on the opposite side. According to an embodiment of the present disclosure, the electrically conductive high adhesion strength adhesive layer 130 is employed to form a permanent connection, and the electrically conductive low adhesion strength adhesive layer 120 is employed to form a removable connection. The side of the electrically conductive higher adhesion strength adhesive layer 130 is herein referred to as a "high adhesion side," and the side of the electrically conductive lower adhesion strength adhesive layer 120 is herein referred to as a "low adhesion side."

It is understood that the electrically conductive high adhesion strength adhesive layer 130 and the electrically conductive low adhesion strength adhesive layer 120 are layers of adhesive materials providing different adhesion strengths. In one embodiment, the electrically conductive high adhesion strength adhesive layer 130 provides adhesion strength that is greater than the peel strength of the electrically conductive low adhesion strength adhesive layer 120. In one embodiment, the peel strength of the electrically conductive high adhesion strength adhesive layer 130 can be at least 120%, such as in a range from 120% to 2,000% (such as from 150% to 1,000%) of the peel strength of the electrically conductive low adhesion strength adhesive layer 120. The peel strength of the electrically conductive high adhesion strength adhesive layer 130 can be greater than a threshold peel strength value, and the peel strength of the electrically conductive low adhesion strength adhesive layer 120 can be less than the peel strength threshold value. For example, the threshold peel strength value can be in a range from 0.5 N/cm to 10 N/cm, such as from 1 N/cm to 5 N/cm, such as 3 N/cm although lesser and greater values can also be employed.

In one embodiment, the adhesive materials of the electrically conductive high/low adhesion strength adhesive layers (130, 120) may be acrylic-based conductive material. In one embodiment, the electrically conductive backing layer 110 includes a flexible woven conductive material. As used herein, a "flexible woven conductive material" refers to a flexible material formed by interweaving of multiple threads of a conductive material. An exemplary commercially available tape for the double sided dual adhesive electrically conductive tape 100 is Tesa® 60251, which is a 55 µm thick double sided electrically conductive removable woven tape. Tesa® 60251 provides initial adhesion to steel of 0.5 N/cm and 14-day post-settlement adhesion to steel of 1.3 N/cm on the removable side, and initial adhesion to steel of 4.6 N/cm and 14-day post-settlement adhesion to steel of 7.6 N/cm on the permanent side. Any other suitable double sided dual adhesive electrically conductive tape may be used instead. In one embodiment, the (14-day) post-settlement adhesion to the cathode conductive strip on the removal (i.e., low adhesion) side is less than 3 N/cm, such as in a range from 0.5 N/cm to 2.5 N/cm, and the (14-day) post settlement adhesion to the cathode electrode of the radiation detector on the permanent (i.e., high adhesion) side is greater than 3 N/cm, such as in a range from 3.5 N/cm to 30 N/cm. As used herein, "post-settlement adhesion to steel" refers to the adhesive property of a material as measured 14 days after application on a surface. Thus, the electrically conductive low adhesion strength adhesive layer 120 can provide post-settlement adhesion to the cathode conductive strip in a range from 0.5 N/cm to 2.5 N/cm, and the electrically conductive high adhesion strength adhesive layer 130 can provide post-settlement adhesion to the cathode electrode in a range from 3.5 N/cm to 30 N/cm. The high adhesion side of the double sided dual adhesive electrically conductive tape 100 is subsequently attached to a cathode electrode of a radiation sensor to partially or wholly cover of the cathode surface.

Figure 2:
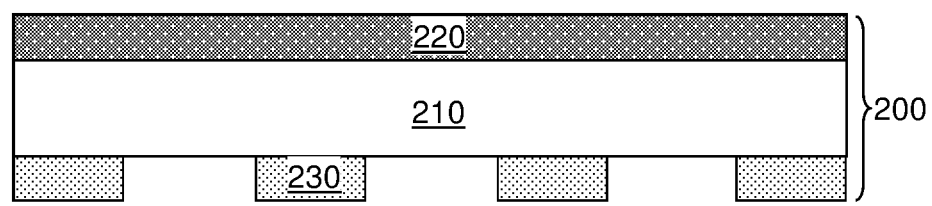
FIG. 2 is a schematic cross-sectional view of a pixelated radiation sensor employed in the methods and structures of the present disclosure.

Referring to FIG. 2, a radiation sensor 200 is illustrated, which can be a pixelated CdZnTe radiation sensor including semiconductor substrate 210, a cathode electrode 220, and an anode electrode 230. The semiconductor substrate 210 can include a semiconductor material such as cadmium zinc telluride (CZT) or other suitable detector materials. The cathode electrode 220 can include a continuous, segmented, or pixelated layer of metallization located on one side of the semiconductor substrate 210. The anode electrode 230 can provide pixelated metallization on the opposite side of the semiconductor substrate 210. Typical metallization materials on both electrodes can be physically or chemically deposited layers of thin conductive metal films such as Pt, Au, Ni, In, or combinations thereof. In one embodiment, the semiconductor substrate 210 can include cadmium zinc telluride, the anode electrode 230 can be a pixelated anode electrode that provides pixelated metallization on a first side of the semiconductor substrate 210, and the cathode electrode can be located on a second side of the semiconductor substrate 210 and can include a metallization layer.

The cathode electrode 220 of the radiation sensor 200 can be attached to a cathode conductive strip 300 (shown in FIG. 3), which can be a flexible printed circuit board (PCB), for high voltage connection. The anode electrode 230 of the radiation sensor 200 can be attached to a printed circuit board carrier with an application-specific integrated circuit (ASIC) thereupon. Additional electrical, mechanical, and thermal control components may be attached to the anode PCB carrier to form a functional radiation detector module.

As used herein, a "sensor assembly" refers to a radiation sensor with at least one PCB attached to the cathode electrode and/or the anode electrode. A "cathode sensor assembly" refers to a sensor assembly with a PCB attached to the cathode electrode. An "anode sensor assembly" refers to a sensor assembly with a PCB attached to the anode electrode. A "detector module" refers to a radiation sensor with a first PCB attached to the cathode electrode and a second PCB attached to the anode electrode. A "radiation detector" refers to any of the above radiation detection devices, i.e., any of a cathode sensor assembly, an anode sensor assembly, and a detector module.

In one embodiment, the radiation sensor 200 can be any of the radiation sensors described in U.S. application Ser. No. 15/014,707 titled "High-performance radiation detectors and methods of fabricating thereof," filed on Feb. 3, 2016, and assigned to Redlen Technologies, the entire contents of which are incorporated herein by reference.

Figure 3:
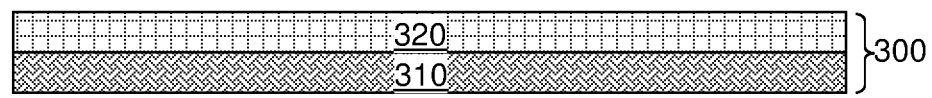
FIG. 3 is a schematic cross-sectional view of a cathode conductive strip employed in the methods and structures of the present disclosure.

Referring to FIG. 3, the cathode conductive strip 300 employed in embodiments of the present disclosure is illustrated in a cross-sectional view. The cathode conductive strip 300 includes a metal conductive layer 310 and optionally includes a backing insulator layer 320. In one embodiment, the cathode conductive strip 300 can include a flexible PCB with the metal conductive layer 310, which may be a copper layer with nickel and gold finishing, coated on the backing insulator layer 320, which may be a Kapton strip. The metal conductive layer 310 can include one or more contact points protruding from embedded conductive traces located within the backing insulator layer 320, one or more conductive traces located over a planar surface of the backing insulator 320, or a continuous metal film covering the entire area of the backing insulator layer 320. Alternatively, the cathode conductive strip 300 can consist of a flexible thin metal strip including a metal such as Al or Cu without a backing insulator layer 320 thereupon. The metal conductive layer 310 in the cathode conductive strip 300 functions as a conductive path for a high voltage connection supplied to the radiation sensor 200. Typically, the cathode conductive strip 300 is longer than the radiation sensor 200 at least in one dimension in order to enable connection to a high voltage supply source.

Figure 4:
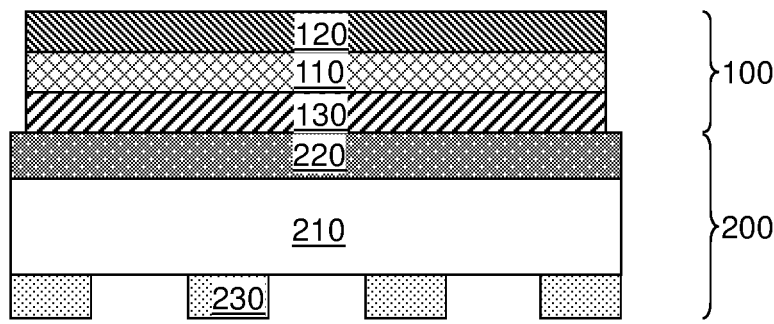
FIG. 4 is a schematic cross-sectional view of an assembly of a radiation sensor and a double sided dual adhesive electrically conductive tape, which is bonded to the radiation sensor on its high adhesion strength side, according to an embodiment of the present disclosure.

Referring to FIG. 4, the double sided dual adhesive electrically conductive tape 100 can be attached to the cathode electrode 220 of the radiation sensor 200 on its high adhesion strength side. In other words, the electrically conductive high adhesion strength adhesive layer 130 of the double sided dual adhesive electrically conductive tape 100 can be attached to the cathode electrode 220 of the radiation sensor 200 before the electrically conductive low adhesion strength adhesive layer 120 is attached to any structure. The surface of the cathode electrode 220 can be wholly or partially covered by the double sided dual adhesive electrically conductive tape 100. In one embodiment, the lateral extent of the double sided dual adhesive electrically conductive tape 100 can be the same as, or can be less than, the lateral extent of the surface of the cathode electrode 220 of the radiation sensor 200.

Figure 5:
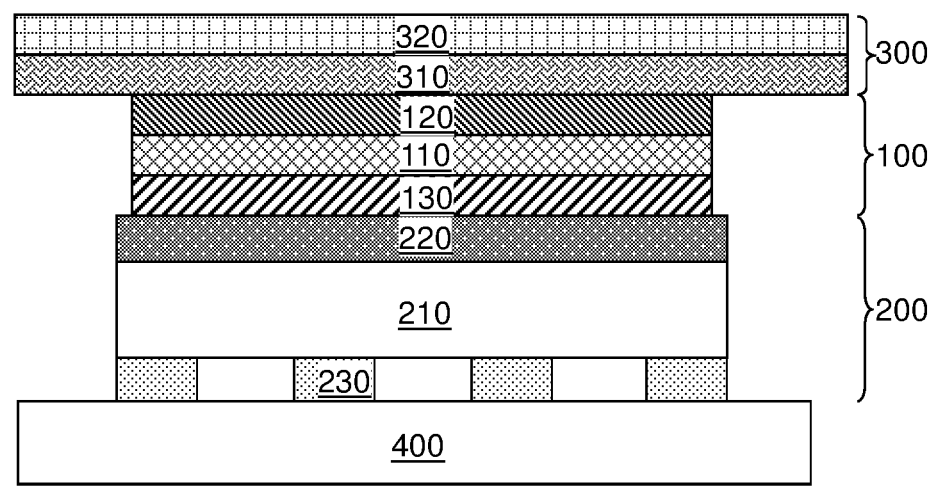
FIG. 5 is a schematic cross-sectional view of a radiation detector module including a cathode conductive strip, a double sided dual adhesive electrically conductive tape, a radiation sensor, and an anode-side PCB carrier with electrical, mechanical and thermal control components according to an embodiment of the present disclosure.

Referring to FIG. 5, the cathode conductive strip 300 can be attached to the double sided dual adhesive electrically conductive tape 100 to form a cathode sensor assembly (100, 200, 300). The lower adhesion strength side of the double sided dual adhesive electrically conductive tape 100 is bonded to the cathode conductive strip 300 on the side with conductive traces, i.e., the metal conductive layer 310. Thus, the metal conductive layer 310 physically contacts the electrically conductive low adhesion strength adhesive layer 120 of the double sided dual adhesive electrically conductive tape 100. The anode electrode 230 of the radiation sensor 200 can be attached to a PCB carrier 400 that can include electrical, mechanical, and/or thermal control components to form a functional radiation detector module (100, 200, 300, 400).

Figure 6:
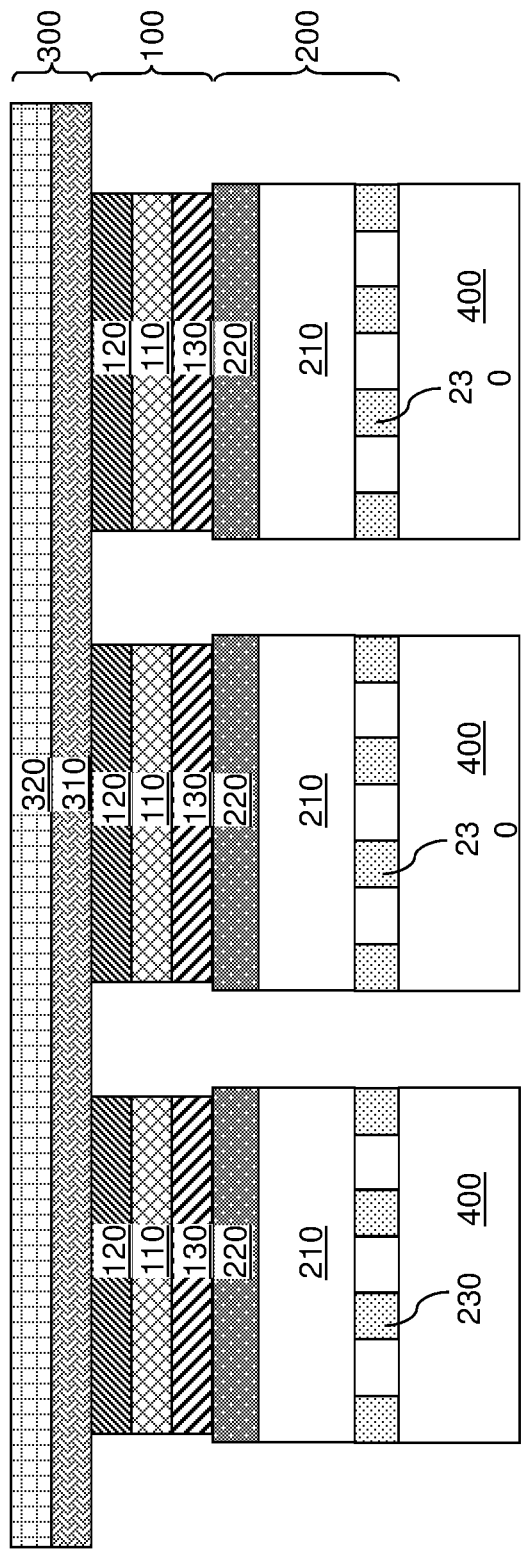
FIG. 6 is a schematic cross-sectional view of a radiation detector module including a cathode conductive strip, an array of double sided dual adhesive electrically conductive tapes, an array of radiation sensors, and an array of anode-side PCB carriers with respective electrical, mechanical and thermal control components according to an embodiment of the present disclosure.

Referring to FIG. 6, an alternative embodiment of the structure of the present disclosure is schematically illustrated, which can be formed by attaching a cathode conductive strip 300 to an array of radiation sensors 200 using multiple double sided dual adhesive electrically conductive tapes 100. For example, one double sided dual adhesive electrically conductive tape 100 can be attached to each radiation sensor 200. In this case, the cathode conductive strip 300 is shared as a common cathode high voltage supply source for the multiple radiation sensors 200. The anode electrodes 230 of these radiation sensors 200 can be attached to PCB carriers 400 with electrical, mechanical, and/or thermal control components to form a functional multi-sensor radiation detector module (100, 200, 300, 400). The cathode conductive strip 300 at one end is usually connected to a common high voltage supply source, usually through a connection pad on a PCB carrier in the detector module. The common high voltage supply source can supply high voltage to each of the cathode electrodes 220 of the radiation sensors 200 in this multi-sensor radiation detector module (100, 200, 300, 400). The configuration illustrated in FIG. 6 can be especially suitable for medical imaging radiation detection applications.

According to an aspect of the present disclosure, non-functional (e.g., inoperative or functioning below a predetermined cut-off performance criteria) radiation sensor 200 within the multi-sensor radiation detector module (100, 200, 300, 400) can be replaced easily with minimal changes to the electrical connection of the multi-sensor radiation detector module (100, 200, 300, 400). For example, each of the double sided dual adhesive electrically conductive tapes 100 can be sequentially detached from the metal conductive layer 310 of the cathode conductive strip 300. Each detached radiation sensor 200, which is attached to a respective detached one of the double sided dual adhesive electrically conductive tapes 100, can be tested for functionality. If the tested radiation sensor 200 is functional, the double sided dual adhesive electrically conductive tape 100 that is attached to the functional radiation sensor 200 can be attached to the metal conductive layer 310 of the cathode conductive strip 300. If the tested radiation sensor 200 is not functional, a combination of a new radiation sensor 200 and a new double sided dual adhesive electrically conductive tape 100 can be attached to the metal conductive layer 310 of the cathode conductive strip 300 in place of the removed sensor to repair the multi-sensor radiation detector module (100, 200, 300, 400).

According to an aspect of the present disclosure, the cathode conductive strip 300 can be easily removed and then re-attached without affecting the physical integrity of the double sided dual adhesive electrically conductive tape(s) 100 on the radiation sensor(s) 200. The double sided dual adhesive electrically conductive tapes 100 can remain on the surfaces of the cathode electrodes 220 of the radiation sensors 200 throughout operation and maintenance of the multi-sensor radiation detector module (100, 200, 300, 400), thereby providing advantage in terms of maintenance cost and time for the multi-sensor radiation detector module (100, 200, 300, 400) of the present disclosure.

Long-term reliability testing on exemplary structure of multi-sensor radiation detector module (100, 200, 300, 400) of the present disclosure has shown that the double sided dual adhesive electrically conductive tape(s) 100 of the present disclosure provides an effective and reliable method for making electrical connections to cathode electrodes 220 of the radiation sensors 200. The long-term reliability testing included temperature cycling, high temperature and humidity soaking, and high-flux X-ray exposure. Such tests were conducted on samples of a cathode sensor assembly employing the double sided dual adhesive electrically conductive tapes of the present disclosure. Specifically, the samples had the configuration shown in FIG. 5, and included a sandwiched CZT sensor as a radiation sensor 200, a Tesa 60251 tape as the double sided dual adhesive electrically conductive tape 100, and an aluminum strip or a Kapton PCB as a cathode conductive strip 300. In the tested samples, the lateral extent of the double sided dual adhesive electrically conductive tape 100 was less than the lateral extent of the cathode electrode 220 of the radiation sensor 200, and thus, the surface of the cathode electrode 220 was only partially covered. The electrical contact resistance of the samples could be measured between the exposed part of the surface of the cathode electrode 220 of the radiation sensor 200 and the cathode conductive strip 300.

Accelerated testing conditions were employed for the long-term reliability testing. The accelerated testing conditions include: 1) temperature cycling between 5° C. and 55° C. with 2.8 hours per cycle for 25 cycles; 2) temperature cycling between −10° C. and 40° C. with 4 hours per cycle for 50 cycles; 3) high temperature and humidity soaking at 40° C. and 85% relative humidity for 3 days; 4) high temperature and humidity soaking at 70° C. and 60% relative humidity for 3 days; 5) X-ray exposure testing at an average photon energy of about 120 keV and a photon flux of about 560 Mcps/mm$^2$ for an accumulative exposure time of over 85 hours. These accelerated testing conditions simulated long-term life of a radiation detector in typical field applications of medical imaging. The electrical contact resistances of these cathode sensor assembly samples were measured at the beginning of, and at the end of, the reliability tests. Comparison of these electrical contact resistances showed no significant changes. In addition, removal of the cathode conductive strips 300 did not cause significant physical or electrical changes to the double sided dual adhesive electrically conductive tapes 100 on the radiation sensors 200. The double sided dual adhesive electrically conductive tapes 100 remained on the surfaces of the cathode electrodes 220 upon removal of the cathode conductive strips 300, and no delamination of metallization on the cathode electrodes 220 of the radiation sensors 200 was observed. The cathode conductive strips 300 were subsequently re-attached to some radiation sensors 200, and the contact resistance between each cathode conductive strip 300 and a respective cathode electrode 220 was re-measured. In one case, removal and re-attachment of the cathode conductive strip 300 was repeated for ten times. The contact resistance between the cathode conductive strip 300 and the cathode electrodes 220 did not change significantly from the initially measured values. The test results confirmed that the method of attaching a cathode conductive strip 300 employing a double sided dual adhesive electrically conductive tape 100 as a bonding medium is a reliable electrical connection method for high voltage connections to the radiation sensors 200 in radiation detector modules.

The radiation detectors of the present embodiments may used for medical imaging, such as in Low-Flux applications in Nuclear Medicine (NM), whether by Single Photon Emission Computed Tomography (SPECT) or by Positron Emission Tomography (PET), or as radiation detectors in High-Flux applications as in X-ray Computed Tomography (CT) for medical applications, and for non-medical imaging applications, such as in baggage security scanning and industrial inspection applications.

While the disclosure has been described in terms of specific embodiments, it is evident in view of the foregoing description that numerous alternatives, modifications and variations will be apparent to those skilled in the art. Each of the embodiments described herein can be implemented individually or in combination with any other embodiment unless expressly stated otherwise or clearly incompatible. Accordingly, the disclosure is intended to encompass all such alternatives, modifications and variations which fall within the scope and spirit of the disclosure and the following claims.

The invention claimed is:

1. A method of making a radiation detector system, comprising:
   providing a double sided dual adhesive electrically conductive tape including an electrically conductive high adhesion strength adhesive layer on one side and an electrically conductive low adhesion strength adhesive layer having a lower peel strength than the electrically conductive high adhesion strength adhesive layer on another side;
   attaching the electrically conductive high adhesion strength adhesive layer to a surface of a cathode electrode of a radiation sensor; and
   attaching the electrically conductive low adhesion strength adhesive layer to a conductive layer of a cathode conductive strip.

2. The method of claim 1, wherein the double sided dual adhesive electrically conductive tape comprises an electrically conductive backing layer located between the electrically conductive high adhesion strength adhesive layer and the electrically conductive low adhesion strength adhesive layer.

3. The method of claim 2, wherein the electrically conductive backing layer comprises a flexible woven conductive material.

4. The method of claim 1, wherein:
   the electrically conductive low adhesion strength adhesive layer provides post-settlement adhesion to the cathode conductive strip in a range from 0.5 N/cm to 2.5 N/cm; and
   the electrically conductive high adhesion strength adhesive layer provides post-settlement adhesion to the cathode electrode in a range from 3.5 N/cm to 30 N/cm.

5. The method of claim 1, wherein the radiation sensor comprises:
   a semiconductor substrate comprising cadmium zinc telluride;
   a pixelated anode electrode located on a first side of the semiconductor substrate; and
   a continuous, segmented, or pixelated cathode electrode located on a second side of the semiconductor substrate.

6. The method of claim 5, further comprising connecting a printed circuit board carrier including at least one of electrical, mechanical, or thermal control components to the anode electrode.

7. The method of claim 1, further comprising providing an electrical connection between the cathode conductive strip and a voltage supply source.

8. The method of claim 1, wherein the cathode conductive strip further comprises a backing insulator layer that is attached to the conductive layer which comprises a metal conductive layer.

9. The method of claim 8, wherein the metal conductive layer comprises a configuration selected from:
   a first configuration in which one or more points of the metal conductive layer protrude from embedded conductive traces located within the backing insulator layer;
   a second configuration in which one or more conductive traces are located over a planar surface of the backing insulator layer; and
   a third configuration in which the metal conductive layer is a continuous metal film that covers an entire area of the backing insulator layer.

10. The method of claim 1, wherein cathode conductive strip consists of a flexible metal strip.

11. The method of claim 1, further comprising:
   providing additional double sided dual adhesive electrically conductive tapes, wherein each of the additional double sided dual adhesive electrically conductive tapes includes a respective electrically conductive high adhesion strength adhesive layer on one side and a respective electrically conductive low adhesion strength adhesive layer on another side;

providing additional radiation sensors;

attaching each electrically conductive high adhesion strength adhesive layer of the additional double sided dual adhesive electrically conductive tapes to a surface of a cathode electrode of a respective one of the additional radiation sensors;

attaching each electrically conductive low adhesion strength adhesive layer of the additional double sided dual adhesive electrically conductive tapes to the conductive layer of the cathode conductive strip.

12. The method of claim 11, further comprising:

detaching one of the double sided dual adhesive electrically conductive tape and the additional double sided dual adhesive electrically conductive tapes from the metal conductive layer of the cathode conductive strip;

testing a radiation sensor attached to the detached one of the double sided dual adhesive electrically conductive tape and the additional double sided dual adhesive electrically conductive tapes;

re-attaching the detached one of the double sided dual adhesive electrically conductive tape and the additional double sided dual adhesive electrically conductive tapes to the metal conductive layer of the cathode conductive strip if the tested radiation sensor is functional; and attaching a combination of a new radiation sensor and a new double sided dual adhesive electrically conductive tape to the metal conductive layer of the cathode conductive strip if the tested radiation sensor is not functional.

13. A radiation detector system, comprising:

a double sided dual adhesive electrically conductive tape including an electrically conductive high adhesion strength adhesive layer on one side and an electrically conductive low adhesion strength adhesive layer having a lesser peel strength than the electrically conductive high adhesion strength adhesive layer on another side;

a radiation sensor including a cathode electrode, wherein the electrically conductive high adhesion strength adhesive layer is attached to a surface of the cathode electrode; and a cathode conductive strip including a conductive layer, wherein the electrically conductive low adhesion strength adhesive layer is attached to the conductive layer.

14. The radiation detector system of claim 13, wherein the double sided dual adhesive electrically conductive tape comprises an electrically conductive backing layer located between the electrically conductive high adhesion strength adhesive layer and the electrically conductive low adhesion strength adhesive layer.

15. The radiation detector system of claim 14, wherein the electrically conductive backing layer comprises a flexible woven conductive material.

16. The radiation detector system of claim 13, wherein:

the electrically conductive low adhesion strength adhesive layer provides post-settlement adhesion to the cathode conductive strip in a range from 0.5 N/cm to 2.5 N/cm; and the electrically conductive high adhesion strength adhesive layer provides post-settlement adhesion to the cathode electrode in a range from 3.5 N/cm to 30 N/cm.

17. The radiation detector system of claim 13, wherein the radiation sensor comprises:

a semiconductor substrate comprising cadmium zinc telluride;

a pixelated anode electrode located on a first side of the semiconductor substrate; and a continuous, segmented, or pixelated cathode electrode located on a second side of the semiconductor substrate.

18. The radiation detector system of claim 17, wherein a printed circuit board carrier including at least one of electrical, mechanical, or thermal control components is connected to the anode electrode.

19. The radiation detector system of claim 13, wherein the cathode conductive strip is electrically connected to a voltage supply source.

20. The radiation detector system of claim 13, wherein the cathode conductive strip further comprises a backing insulator layer that is attached to the conductive layer which comprises a metal conductive layer.

21. The radiation detector system of claim 13, wherein cathode conductive strip consists of a flexible metal strip.

22. The radiation detector system of claim 13, further comprising:

additional double sided dual adhesive electrically conductive tapes, wherein each of the additional double sided dual adhesive electrically conductive tapes includes a respective electrically conductive high adhesion strength adhesive layer on one side and a respective electrically conductive low adhesion strength adhesive layer on another side; and additional radiation sensors, wherein:

each electrically conductive high adhesion strength adhesive layer of the additional double sided dual adhesive electrically conductive tapes is attached to a surface of a cathode electrode of a respective one of the additional radiation sensors; and each electrically conductive low adhesion strength adhesive layer of the additional double sided dual adhesive electrically conductive tapes is attached to the metal conductive layer of the cathode conductive strip.

* * * * *